US012211714B2

(12) United States Patent
Rice

(10) Patent No.: US 12,211,714 B2
(45) Date of Patent: *Jan. 28, 2025

(54) RECONFIGURABLE MAINFRAME WITH REPLACEABLE INTERFACE PLATE

(71) Applicant: Applied Materials, Inc., Santa clara, CA (US)

(72) Inventor: Michael R. Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 927 days.

This patent is subject to a terminal disclaimer.

(21) Appl. No.: 17/322,633

(22) Filed: May 17, 2021

(65) Prior Publication Data

US 2021/0272825 A1 Sep. 2, 2021

Related U.S. Application Data

(63) Continuation of application No. 16/812,214, filed on Mar. 6, 2020, now Pat. No. 11,049,740.
(Continued)

(51) Int. Cl.
*G11C 11/00* (2006.01)
*B65G 47/90* (2006.01)
(Continued)

(52) U.S. Cl.
CPC ........ *H01L 21/67196* (2013.01); *B65G 47/90* (2013.01); *G06F 12/00* (2013.01);
(Continued)

(58) Field of Classification Search
CPC .................................................... G06F 12/00
See application file for complete search history.

(56) References Cited

U.S. PATENT DOCUMENTS 5,746,434 A * 5/1998 Boyd .................. H01L 21/6719
414/217
6,045,620 A 4/2000 Tepman et al.
(Continued)

FOREIGN PATENT DOCUMENTS

CN 101108328 A 1/2008
CN 102097289 A 6/2011
(Continued)

OTHER PUBLICATIONS

International Search Report and Written Opinion of International application No. PCT/US2020/062061 dated Mar. 22, 2021, 10 pages.

*Primary Examiner* — Pho M Luu
(74) *Attorney, Agent, or Firm* — Lowenstein Sandler LLP

(57) ABSTRACT

A mainframe of a device fabrication system comprises a base and a plurality of facets on the base. Each facet of the plurality of facets comprises a frame. The mainframe further comprises a plurality of replaceable interface plates. Each replaceable interface plate of the plurality of replaceable interface plates is attached to a respective facet such that at most one replaceable interface plate is attached to each facet. At least one replaceable interface plate comprises one or more access ports. The mainframe further comprises a lid over the plurality of facets. The base, the lid and the plurality of facets with the attached plurality of replaceable interface plates together define an interior volume of the mainframe. The mainframe further comprises a robot arm in the interior volume.

20 Claims, 7 Drawing Sheets

Related U.S. Application Data

(60) Provisional application No. 62/944,306, filed on Dec. 5, 2019.

(51) Int. Cl.
*G06F 12/00* (2006.01)
*H01L 21/67* (2006.01)
*H01L 21/677* (2006.01)
*H01L 21/687* (2006.01)

(52) U.S. Cl.
CPC .. *H01L 21/67167* (2013.01); *H01L 21/67742* (2013.01); *H01L 21/68707* (2013.01)

(56) References Cited

U.S. PATENT DOCUMENTS

| | | | |
|---|---|---|---|
| 6,216,328 B1* | 4/2001 | Boyd | H01L 21/67196 29/557 |
| 6,652,219 B2 | 11/2003 | Davis et al. | |
| 7,575,406 B2 | 8/2009 | Hofmeister et al. | |
| 7,720,655 B2 | 5/2010 | Rice | |
| 8,430,620 B1 | 4/2013 | Blank | |
| 8,672,605 B2 | 3/2014 | van der Meulen et al. | |
| 8,851,817 B2 | 10/2014 | Bonora et al. | |
| 9,048,271 B2 | 6/2015 | Oosterlaken | |
| 9,355,876 B2 | 5/2016 | Reuter et al. | |
| 9,717,147 B2 | 7/2017 | Rice et al. | |
| 11,049,740 B1* | 6/2021 | Rice | H01L 21/68707 |
| 2003/0035705 A1 | 2/2003 | Johnson | |
| 2005/0005847 A1 | 1/2005 | Tsutomu | |
| 2011/0038692 A1 | 2/2011 | Hofmeister et al. | |
| 2017/0290166 A1 | 10/2017 | Rice et al. | |
| 2017/0352562 A1 | 12/2017 | Kurita et al. | |
| 2018/0308728 A1 | 10/2018 | Krupyshev et al. | |
| 2018/0342409 A1 | 11/2018 | Shindo | |
| 2019/0355599 A1 | 11/2019 | Shindo | |
| 2019/0355604 A1 | 11/2019 | Kawabe | |
| 2021/0010598 A1 | 1/2021 | Toshihiro et al. | |
| 2023/0317478 A1* | 10/2023 | Decottignies | H01L 21/67184 118/729 |

FOREIGN PATENT DOCUMENTS

| | | |
|---|---|---|
| CN | 110504190 A | 11/2019 |
| JP | H0864542 A | 3/1996 |
| JP | 2002138803 A | 5/2002 |
| JP | 2007309382 A | 11/2007 |
| JP | 2010135485 A | 6/2010 |
| JP | 2013171871 A | 9/2013 |
| JP | 2018198305 A | 12/2018 |
| JP | 2019523143 A | 8/2019 |
| JP | 5551346 A | 12/2019 |
| KR | 0172159 B1 | 3/1999 |
| KR | 20060010125 A | 2/2006 |
| KR | 20120095071 A | 8/2012 |
| KR | 101514108 B1 | 4/2015 |
| KR | 20180128349 A | 12/2018 |
| KR | 20190002965 A | 1/2019 |
| KR | 20190117591 A | 10/2019 |
| TW | 200800739 A | 1/2008 |
| TW | 201406511 A | 2/2014 |
| TW | 201628119 A | 8/2016 |
| TW | 201909321 A | 3/2019 |
| WO | 2013120054 A1 | 8/2013 |

* cited by examiner

RECONFIGURABLE MAINFRAME WITH REPLACEABLE INTERFACE PLATE

RELATED APPLICATIONS

This patent application is a continuation of U.S. patent application Ser. No. 16/812,214, filed Mar. 6, 2020, now U.S. Pat. No. 11,049,790 issued Jun. 29, 2021, which claims the benefit under 35 U.S.C. § 119 (e) of U.S. Provisional Application No. 62/944,306, filed Dec. 5, 2019, both of which are incorporated by reference herein.

FIELD OF THE DISCLOSURE

Embodiments of the present disclosure relate generally to electronic device manufacturing systems, and more particularly to a reconfigurable mainframe of an electronic device manufacturing system that includes a replaceable interface plate. Embodiments also relate to replaceable interface plates for mainframes.

BACKGROUND OF THE DISCLOSURE

Conventional electronic device manufacturing systems (also referred to as device fabrication systems) may include a mainframe around which multiple process chambers and load lock chambers are arranged. The mainframe may have a number of side walls (commonly referred to as "facets") to which process chambers and/or load lock chambers are coupled. The facets of conventional mainframes are machined to have a pre-arranged configuration with substrate access ports that have predetermined sizes, positions, etc. Once a conventional mainframe is manufactured, the type, size, arrangement and location of substrate access ports are fixed for that mainframe. If an owner of the mainframe wants a new configuration, then a new mainframe having the new configuration is then purchased.

SUMMARY OF THE DISCLOSURE

According to a first aspect of the disclosure, a mainframe of a device fabrication system includes a base, a plurality of facets on the base, and a lid over the plurality of facets. A first facet of the plurality of facets includes a first frame. The base, the lid and the plurality of facets together define an interior volume that includes a robot arm. A first replaceable interface plate is attached to the first frame of the first facet. The first replaceable interface plate includes a plurality of substrate access ports. A first substrate access port of the plurality of substrate access ports is configured to provide access for the robot arm to a first process chamber. A second substrate access port of the plurality of substrate access ports is configured to provide access for the robot arm to a second process chamber. In one embodiment, the first replaceable interface plate is load bearing, and the frame is not load bearing.

According to a second aspect of the disclosure, a replaceable interface plate is configured for attachment to a facet of a mainframe. The replaceable interface plate includes a plurality of substrate access ports. A first substrate access port of the plurality of substrate access ports is configured to provide access from the mainframe to a first process chamber. A second substrate access port of the plurality of substrate access ports is configured to provide access from the mainframe to a second process chamber. The replaceable interface plate is load bearing for the mainframe. Accordingly, the replaceable interface plate is configured to bear vertical forces on the mainframe caused by differences in pressure between an interior volume of the mainframe and an exterior of the mainframe.

According to a third aspect of the disclosure, a method of configuring a mainframe includes determining a first plurality of process chambers to be coupled to a first facet of the mainframe, determining locations of a plurality of substrate access ports on the facet that will accommodate the first plurality of process chambers, determining a configuration of a first replaceable interface plate having one of the plurality of substrate access ports at each of the locations, and manufacturing the first replaceable interface plate. The method further includes attaching the first replaceable interface plate to the first facet of the mainframe, and attaching the plurality of process chambers to the first replaceable interface plate, wherein each of the plurality of process chambers is accessible from the mainframe through a substrate access port of the plurality of substrate access ports. The method may be performed after the mainframe has already been manufactured (e.g., to change a configuration of the mainframe).

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1A:
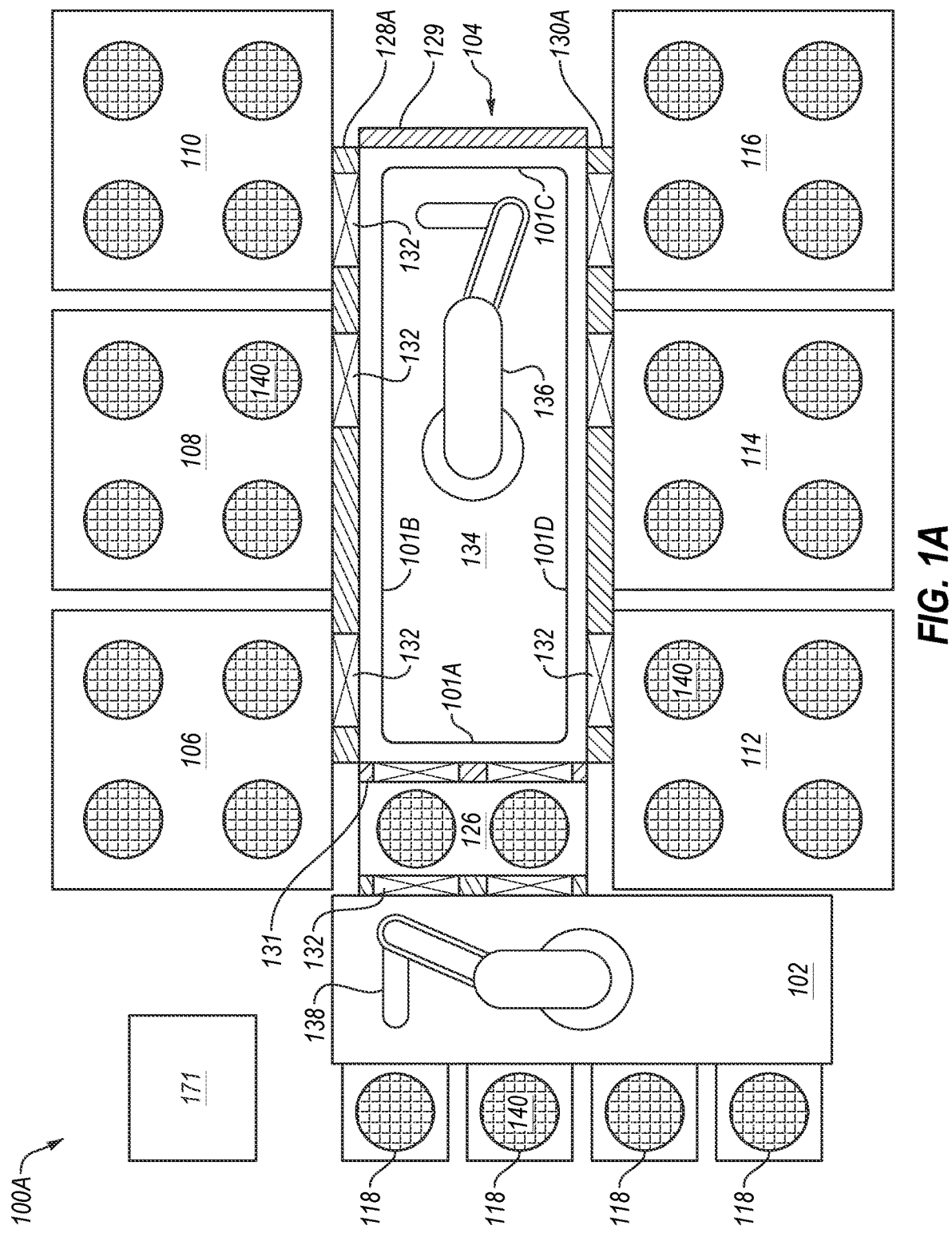
FIG. 1A illustrates a schematic top view of an electronic device manufacturing system having a reconfigurable mainframe with a first configuration, in accordance with an embodiment of the present disclosure.

Embodiments are directed to a reconfigurable mainframe (also referred to as a transfer chamber) with one or more replaceable interface plates. The reconfigurable mainframe includes multiple facets, where at least one of the facets includes a frame configured to accept a replaceable interface plate. In one embodiment, the reconfigurable mainframe includes a frame for each facet of the reconfigurable mainframe. A replaceable interface plate may attach to each of the frames. A lid may be positioned over the frames of the facets, and may be secured to the replaceable interface plates. In embodiments, the replaceable interface plates are load bearing, and the frames are not load bearing. Accordingly, when an interior volume of the mainframe is pumped down to vacuum, vertical (and horizontal) forces are sustained by the replaceable interface plates, but little or no forces are applied to the frames.

In some embodiments, the mainframe may have a square or rectangular shape. One or more load lock chambers may be coupled to one facet of the mainframe. In one embodiment, the one or more load lock chambers are coupled to a replaceable interface plate on one facet of the mainframe. In one embodiment, additional replaceable interface plates are connected to one or more additional facets of the mainframe, and one or more process chambers are coupled to some or all of the additional replaceable interface plates. The process chambers may perform various substrate processes, and the process chambers coupled to different replaceable interface plates on the facets may be of different size, have different size substrate access ports, have different connection types, have different heights, and so on. For example, some substrate access ports may include heights that accommodate two end effectors at different pitches). Also, each replaceable interface plate may be configured to couple to the same number or a different number of process and/or load lock chambers. For example, one replaceable interface plate may be configured to couple to a single process chamber of a first size, a second replaceable interface plate may be configured to couple to two process chambers each of a second size different than the first size, and so on. One or more substrate access ports on each replaceable interface plate may interface each of the load lock and process chambers with the transfer chamber to allow substrates to be transferred there between. The substrate access ports may be sized and positioned on each replaceable interface plate to accommodate the number and size of chambers that may be coupled to each facet. Electronic device manufacturing systems having such a mainframe may allow a wider variety and more diverse sequences of substrate processes to be performed in a single system, thus improving versatility, capability, and/or efficiency of such electronic device manufacturing systems. In other aspects, methods of assembling an electronic device manufacturing system are provided.

The reconfigurable mainframe and replaceable interface plates disclosed in embodiments provide multiple advantages over traditional mainframes. A traditional mainframe has a single design that is determined at the time of manufacture. That single design has a fixed number of substrate access ports with fixed size and fixed position. If at any time it would be advantageous to change a configuration of such a conventional mainframe, the available option is to purchase a new mainframe having the new configuration. In contrast, the reconfigurable mainframe can be reconfigured at any time by manufacturing new replaceable interface plates. If a new configuration would be beneficial, then one or more new replaceable interface plates having the new configuration may be manufactured. The existing replaceable interface plates may then be removed from the mainframe, and the new replaceable interface plates may be attached to the mainframe. Thus, the flexibility of mainframes is significantly improved in embodiments. Furthermore, the useful lifespan of mainframes can be increased because the mainframes can be updated with new replaceable interface plates as new process chambers become available, new slit valve technologies are developed, new local center finding (LCF) technologies are developed (e.g., using light emitting diodes (LEDs), lasers and/or other scanning methods to determine where a wafer resides within a pocket of a robot blade or end effector), and so on. Old replaceable interface plates having out dated slit valve technologies, outdated local center finding technologies, etc. can be swapped out with new replaceable interface plates that have new slit valve technologies and/or new local center finding technologies, for example.

As used herein, the singular forms "a," "an," and "the" include plural references unless the context clearly indicates otherwise. Thus, for example, reference to "a substrate" includes a single substrate (e.g., a single wafer) as well as a mixture of two or more substrates; and reference to a "process chamber" includes a process chamber as well as a mixture of two or more process chambers, and the like.

As used herein, the term "about" in connection with a measured quantity, refers to the normal variations in that measured quantity, as expected by one of ordinary skill in the art in making the measurement and exercising a level of care of one skilled in the art and the precision of the measuring equipment. In certain embodiments, the term "about" includes the recited number ±10%, such that "about 10" would include from 9 to 11.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

Figure 1B:
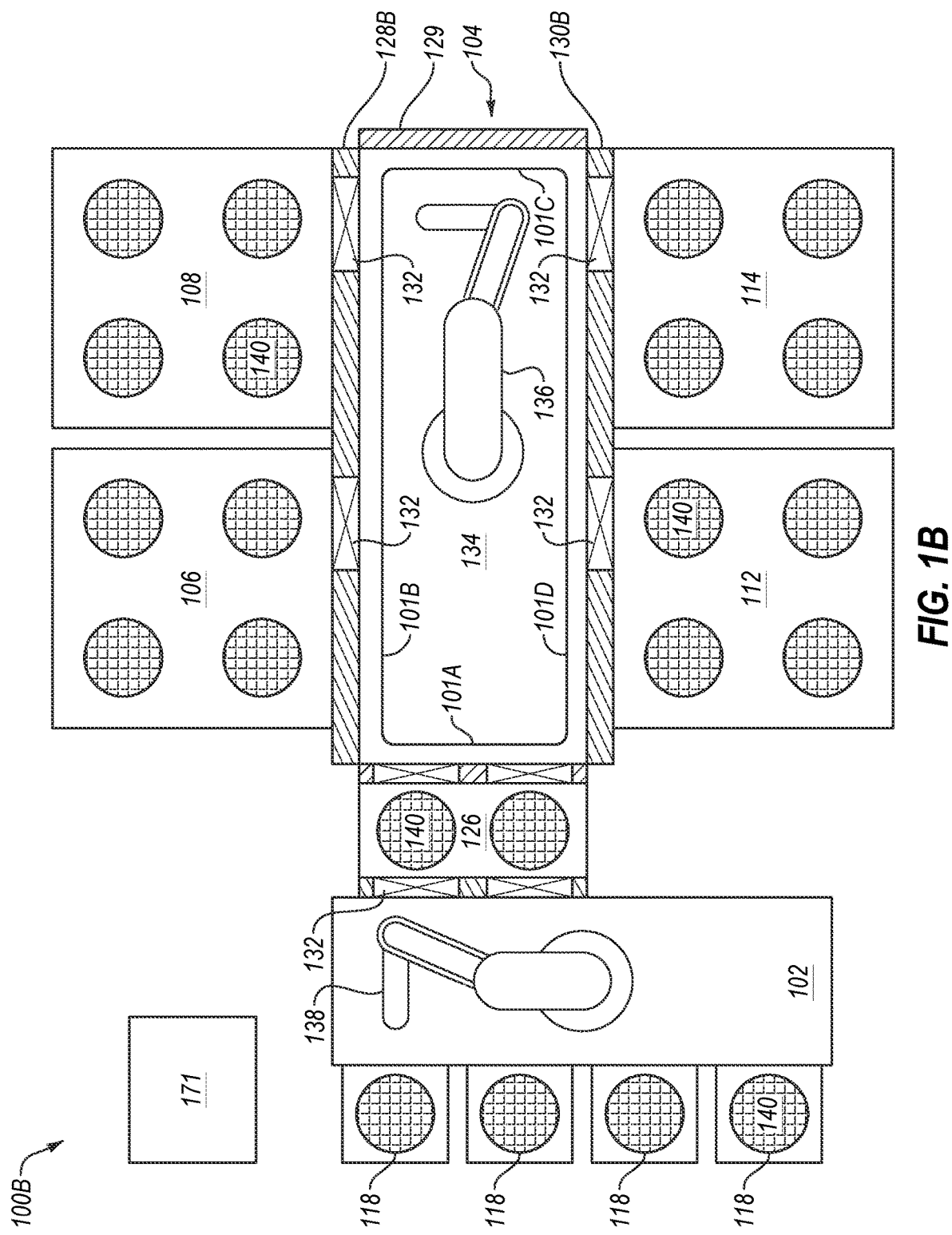
FIG. 1B illustrates a schematic top view of an electronic device manufacturing system having a reconfigurable mainframe with a second configuration, in accordance with an embodiment of the present disclosure.
Figure 1C:
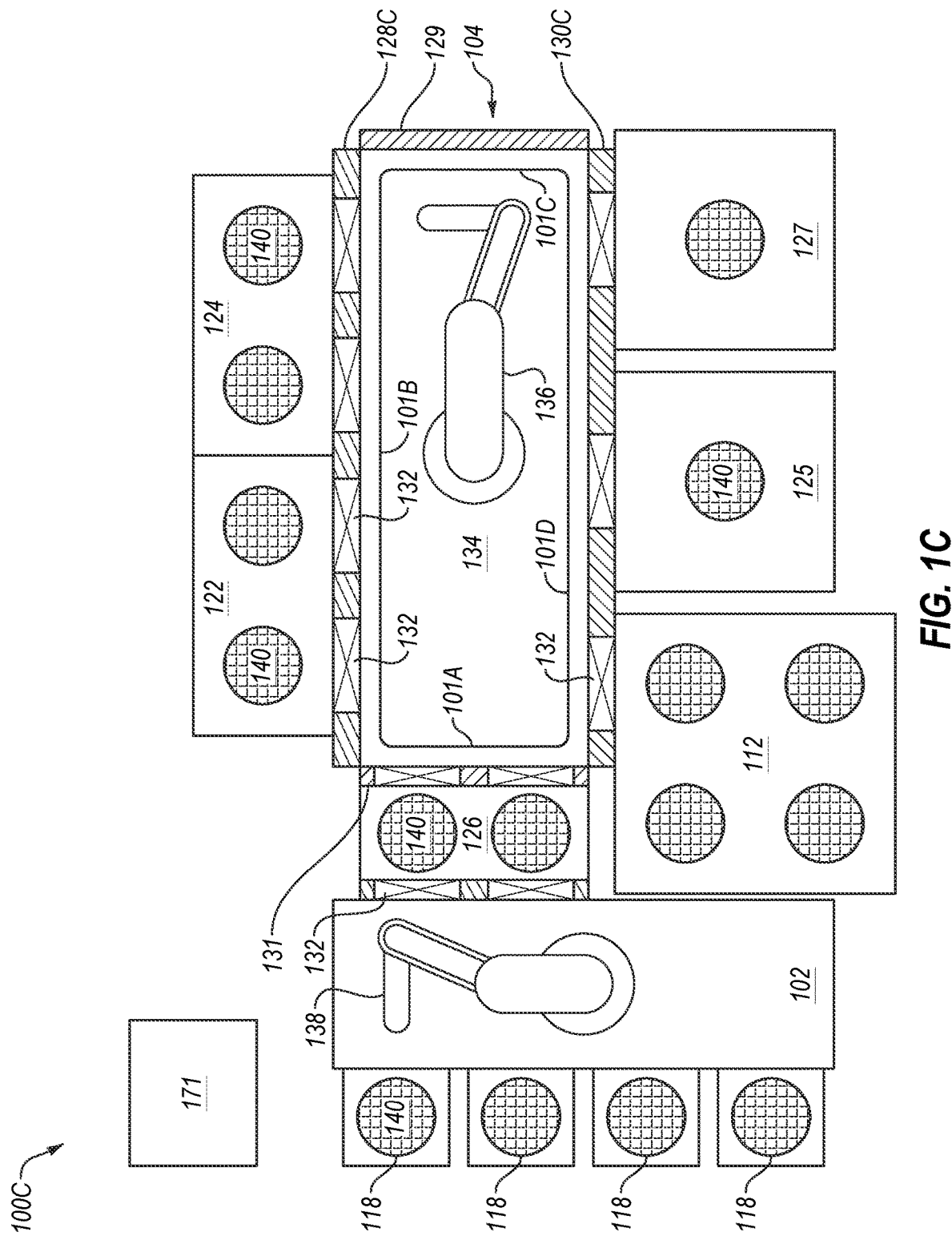
FIG. 1C illustrates a schematic top view of an electronic device manufacturing system having a reconfigurable mainframe with a third configuration, in accordance with an embodiment of the present disclosure.

FIGS. 1A-C illustrate schematic top views of an electronic device manufacturing system having a reconfigurable mainframe. FIG. 1A illustrates a schematic top view of a first configuration 100A of the electronic device manufacturing system, in accordance with an embodiment of the present disclosure. FIG. 1B illustrates a schematic top view of a second configuration 100B of the electronic device manufacturing system, in accordance with an embodiment of the present disclosure. FIG. 1C illustrates a schematic top view of a third configuration 100C of the electronic device manufacturing system, in accordance with an embodiment of the present disclosure.

The electronic device manufacturing system is configured to process substrates and may include a mainframe (also referred to as a transfer chamber) 104 having four facets 101A-D. Though four facets 101A-D are illustrated in a rectangular configuration, the mainframe 104 may alternatively have other numbers of facets (e.g., such as 5 facets, 6 facets, 7 facets, 8 facets, etc.) and/or other shapes. The facets may have the same sizes (e.g., the same widths) or different sizes in embodiments. In one embodiment, the mainframe 104 has a rectangular shape, with facets 101A and 101C being approximately parallel to one another, facets 101B and 101D being approximately parallel to one another, and facets 101A and 101C being approximately perpendicular to facets 101B and 101D. In one embodiment, facets 101B and 101D have a first length that is at least two times a second length of facets 101A and 101C. In one embodiment, facets 101B and 101D have a length of about 100-150 inches, and facets 101A and 101C have a length of about 40-60 inches. In one embodiment, the mainframe 104 has a pentagonal shape. In one embodiment, the mainframe includes a first facet having a first length, second and third facets on either side of the first facet, each having a second length that is greater than the first length, and a fourth and fifth facet connected to the second and third facet, respectively, each having a third length that is greater than or equal to the first length and less than the second length.

Mainframe 104 may include an interior volume 134, wherein facets 101A-D may define the side walls of the interior volume 134. The mainframe 104 may additionally include a base (not shown) and a lid (not shown). The facets 101A-D, base and lid may together define the interior volume 134. A robot arm (also referred to as a robot assembly) 136 may be disposed within the interior volume 134 of the mainframe 104. The interior volume 134 may typically be under vacuum during operation of the mainframe 104.

Each of facets 101A-D may comprise a frame and may have attached thereto a replaceable interface plate. Alternatively, a subset of the facets 101A-D may comprise frames with replaceable interface plates attached thereto. Other facets may be manufactured in a conventional manner with built-in sidewalls having a fixed configuration. For each facet having a frame rather than a fixed configuration, a replaceable interface plate may be attached to the frame of the facet, and may form the sidewall of the facet. At any time an existing replaceable interface plate attached to a facet may be removed, and a new replaceable interface plate having a different design may be attached to that facet. Thus, the mainframe 104 is a reconfigurable mainframe with a flexible design.

In FIG. 1A, a replaceable interface plate 128A is attached to facet 101B, a replaceable interface plate 129 is attached to facet 101C, a replaceable interface plate 130A is attached to facet 101D, and a replaceable interface plate 131 is attached to facet 101A. Replaceable interface plate 128A has three substrate access ports 132. Each substrate access port 132 may be configured to allow a horizontally-oriented substrate 140 to pass there through. Substrate 140 may be a wafer (e.g., a semiconductor wafer or a non-semiconductor device substrate), glass plate or panel, and/or other workpiece used to make electronic devices or circuit components. Each substrate access port 132 may be, e.g., an elongated slot or slit formed in a side wall of mainframe 104 or in a replaceable interface plate 128A, 130A, and each may include, e.g., a slit valve or other suitable device for opening and closing a substrate access port 132 and/or a local center finder (LCF) suitable for determining a position of a substrate 140 transferred through a substrate access port 132. Slit valves may be of any suitable conventional construction, such as, e.g., L-motion slit valves. Other suitable devices may also be used for opening and closing substrate access ports 132. Substrate access ports 132 may include single gates or dual gates (e.g., with a first gate on an interior of the replaceable interface plate at a substrate access port and a second gate on an exterior of the replaceable interface plate at the substrate access port) in embodiments.

Three process chambers 106, 108, 110 are attached to the replaceable interface plate 128A. Each of the process chambers 106-110 has a chamber port that lines up with a substrate access port 132 in the replaceable interface plate 128A.

Replaceable interface plate 130A has three substrate access ports 132. Three process chambers 112, 114, 116 are attached to the replaceable interface plate 130A. Each of the process chambers 112-116 has a chamber port that lines up with a substrate access port 132 in the replaceable interface plate 130A.

Replaceable interface plate 129 is a solid plate that has no substrate access ports. Replaceable interface plate 131 includes two substrate access ports 132. Replaceable interface plate 131 is coupled to one or more load lock chamber 126 (which may include two side-by-side load lock chambers, for example). The load lock chambers 126 each have a chamber port that lines up with one of the substrate access ports in the replaceable interface plate 131.

Load lock chambers 126 may each be a batch-type or single substrate-type of load lock chamber. In some embodiments, load lock chamber 126 may be a stacked load lock chamber. For example, load lock chamber 126 may be a double-stacked load lock chamber, a triple-stacked load lock chamber, a load lock chamber with four or more stacked load locks (e.g., a quad load lock chamber), and so on. Alternatively, load lock chamber 126 may be a single volume load lock chamber. Each of load lock chambers 126 may have one or more chamber ports corresponding to a respective substrate access port 132. For example, a stacked load lock chamber 126, which may have two separate substrate volumes, may have two vertically-aligned chamber ports corresponding respectively to vertically aligned substrate access ports 132. A triple-stacked load lock chamber, which may have three separate substrate volumes, may have three vertically-aligned chamber ports corresponding to vertically aligned substrate access ports. Single volume load lock chambers may have a single chamber port corresponding to a single substrate access port 132. Any one or more of load lock chambers 126 may be a stacked load lock chamber, a triple-stacked load lock chamber, and/or a single volume load lock chamber. Also, in some embodiments, any one or more of load lock chambers 126 may be a process-capable chamber. That is, any one or more of load lock chambers 126, or any one of the volumes located therein, may be capable of performing a substrate pre-heating process, an abatement process, a cooling process, and/or another treatment process.

Mainframe 104, process chambers 106-116, and/or load lock chambers 126 may each operate at a vacuum pressure. Process chambers 106-116 may each perform a same or different process on a substrate 140 including, e.g., deposition, oxidation, nitridation, etching, polishing, cleaning, lithography, inspection, or the like. Other processes may also be performed therein.

Mainframe 104 may also include a robot assembly 136 in the interior volume 134. Robot assembly 136 may be configured to transfer one or more substrates 140 to and from each process chamber 106-116 and load lock chamber 126. Robot assembly 136 may be configured to transfer substrates 140 from any one chamber directly to any other chamber attached to mainframe 104. In some embodiments, substrates 140 may be transferred by robot assembly 136 in any sequence or direction. In some embodiments, robot assembly 136 may have dual transport blades (or more transport blades, also referred to as end effectors) each independently projectable and retractable to and from any chamber attached to mainframe 104, thus increasing system throughput by enabling concurrent substrate transfers. In some embodiments, robot assembly 136 may have a single transport blade and/or may be a SCARA (selective compliance articulated robot arm) robot. Alternatively, robot assembly 136 may be any suitable mechanism for transferring substrates between the chambers attached to mainframe 104, such as a linear robot or a non-linear robot.

Load lock chambers 126 may be coupled to a factory interface 102, which may be coupled to one or more FOUPs (front opening unified pods) 118. One or more load lock chambers 126 may provide a first vacuum interface between factory interface 102 and the transfer chamber 126. In some embodiments, each of load lock chambers 126 may increase substrate throughput by alternately communicating with mainframe (transfer chamber) 104 and factory interface 102. That is, while one load lock chamber 126, or any one volume of a stacked or triple-stacked load lock chamber, communicates with transfer chamber 104, the other load lock chambers 126, or the other volumes of a stacked or triple-stacked load lock chamber, may communicate with factory interface 102. Substrate transfers between factory interface 102, load lock chambers 126, and transfer chamber 104 may be made in any other suitable manner.

FOUPs 118 may each be a container having a stationary cassette therein for holding multiple substrates. FOUPs 118 may each have a front opening interface configured to be used with factory interface 102. Factory interface 102 may have a buffer chamber (not shown) and one or more robot assemblies 138 configured to transfer substrates 140 via linear, rotational, and/or vertical movement between FOUPs 118 and load lock chambers 126. Substrates may be transferred between FOUPs 118 and load lock chambers 126 in any sequence or direction. Load lock chambers 126 may each be a batch-type or single substrate-type of load lock chamber.

A controller 171 may control robot assembly 138, robot assembly 136 and/or the operation of the electronic device manufacturing system. The controller 171 may control the processing and transferring of substrates 140 in and through the electronic device manufacturing system. Controller 171 may be, e.g., a general purpose computer and/or may include a microprocessor or other suitable CPU (central processing unit), a memory for storing software routines that control electronic device manufacturing system, input/output peripherals, and support circuits (such as, e.g., power supplies, clock circuits, circuits for driving robot assembly 138, 136, a cache, and/or the like). Controller 171 may be programmed to, e.g., process one or more substrates sequentially through each of the process chambers attached to mainframe 104. In other embodiments, controller 171 may be programmed to process a substrate in any order through the process chambers. In still other embodiments, controller 171 may be programmed to skip and/or repeat processing of one or more substrates in one or more process chambers. Controller 171 may alternatively be programmed to process one or more substrates in the electronic device manufacturing system in any suitable manner.

The electronic device manufacturing system may have other suitable numbers of FOUPs 118 and/or load lock chambers 126 than those shown. In some embodiments, the number of load lock chambers coupled to facet 101A may be independent of the number of process chambers coupled to any one of facets 101B-D. For example, the number of load lock chambers may be different than the highest number of process chambers coupled to a facet. Also, in some embodiments, up to four process chambers may be coupled to a single facet, or more than four process chambers may be coupled to a single facet, depending on the size of mainframe 104 relative to the size(s) of the four process chambers.

FIG. 1B illustrates the same FOUPs 118, factory interface 102, load locks 126 and mainframe 104 as shown in FIG. 1A. However, in FIG. 1B replaceable interface plate 128A has been removed from facet 101B and replaceable interface plate 128B has been attached to facet 101B. Similarly, replaceable interface plate 130A has been removed from face 101D and replaceable interface plate 130B has been attached to facet 101D. Replaceable interface plate 128B has two substrate access ports 132, as opposed to the three substrate access ports 132 of replaceable interface plate 128A. Similarly, replaceable interface plate 130B has two substrate access ports 132, as opposed to the three substrate access ports 132 of replaceable interface plate 130A. Accordingly, in the second configuration 100B, process chambers 106, 108, 112 and 114 have been repositioned, and process chambers 110 and 116 have been removed.

FIG. 1C illustrates the same FOUPs 118, factory interface 102, load locks 126 and mainframe 104 as shown in FIGS. 1A-B. However, in FIG. 1C replaceable interface plate 128A has been removed from facet 101B and replaceable interface plate 128C has been attached to facet 101B. Similarly, replaceable interface plate 130A has been removed from face 101D and replaceable interface plate 130C has been attached to facet 101D. Replaceable interface plate 128C has four substrate access ports 132, as opposed to the three substrate access ports 132 of replaceable interface plate 128A. Replaceable interface plate 130C has three substrate access ports 132, but they are in different positions than the three substrate access ports 132 of replaceable interface plate 130A. In the third configuration 100C, process chamber 112 is in the same position, but process chambers 106, 108, 110, 114 and 116 have been removed and replaced with process chambers 122, 124, 125 and 127.

As shown, any type of process chamber may connect to a facet of the mainframe 104 via a replaceable interface plate. Some examples of process chambers include quad process chambers (e.g., including process chambers 106-116), single process chambers (e.g., including process chambers 125, 127) and twin process chambers (e.g., including process chambers 122, 124).

Each of the substrate access ports 132 may share a size or be of a different size. Each replaceable interface plate 128A-C, 130A-C, 129, 131 may include the same or a different number of substrate access ports 132, which may be of similar or different sizes. For example, some substrate access ports may have a first width (e.g., to receive 200 mm wafers), some substrate access ports may have a second width (e.g., to receive 300 mm wafers), and some substrate access ports may have a third width. The width of each substrate access port 132 is at least wide enough to allow a substrate 140 to pass there through. The different sizes of substrate access ports may allow robot assembly 136 to reach different areas within a chamber coupled to one of facets 101A-D. In some embodiments wherein replaceable interface plate has two or more substrate access ports, the substrate access ports may not be laterally centered in the substrate interface plate and/or equidistantly spaced from each other. In some embodiments wherein a replaceable interface plate has a single substrate access port, that substrate access port may be laterally centered in the facet or offset.

In an example, the replaceable interface plate 128A is interchangeable with a plurality of additional replaceable interface plates that have a) a different number of substrate access ports than the replaceable interface plate 128A, b) different locations of one or more substrate access ports as compared to the plurality of substrate access ports in the replaceable interface plate 128A, c) different sizes of one or more substrate access ports as compared to the plurality of substrate access ports in the replaceable interface plate 128A, d) a different type of slit valves than the replaceable interface plate 128A, and/or e) a different type of local center finder than the replaceable interface plate 128A.

Each of the replaceable interface plates may have various numbers, sizes, and/or combinations of substrate access ports, provided the width of a facet is suitable for accommodating those numbers, sizes, and/or combinations of substrate access ports. For example, in some embodiments, a replaceable interface plate may have one substrate access port 132 instead of three substrate access ports 132. In other embodiments, one replaceable interface plate may have one substrate access port 132 of a first width and one substrate access port 132 of a second width, while another replaceable interface plate may have one substrate access port of the first width and one substrate access port of a third width. Various combinations of substrate access ports may be possible provided the facet has a suitable width. This allows a mainframe 104 to be customized for coupling to specific types and numbers of process and load lock chambers. In an example, the first width may be about 1.2 meters, the second width may be about 2.4 meters, and the third width may be about 800 mm.

In some embodiments, two electronic device manufacturing systems may be clustered. That is, one facet of each mainframe 104, such as, e.g., a facet 101C of a first mainframe and a facet of a second mainframe 202, may each include replaceable interface plates that enable the two mainframes to be coupled (e.g., with one or more load lock interposed between the two mainframes). The mainframes may be coupled in a manner that provides a pass-through chamber for transferring substrates between the two mainframes. This may further enhance the versatility, capability, and/or efficiency of such electronic device manufacturing systems.

Figure 2A:
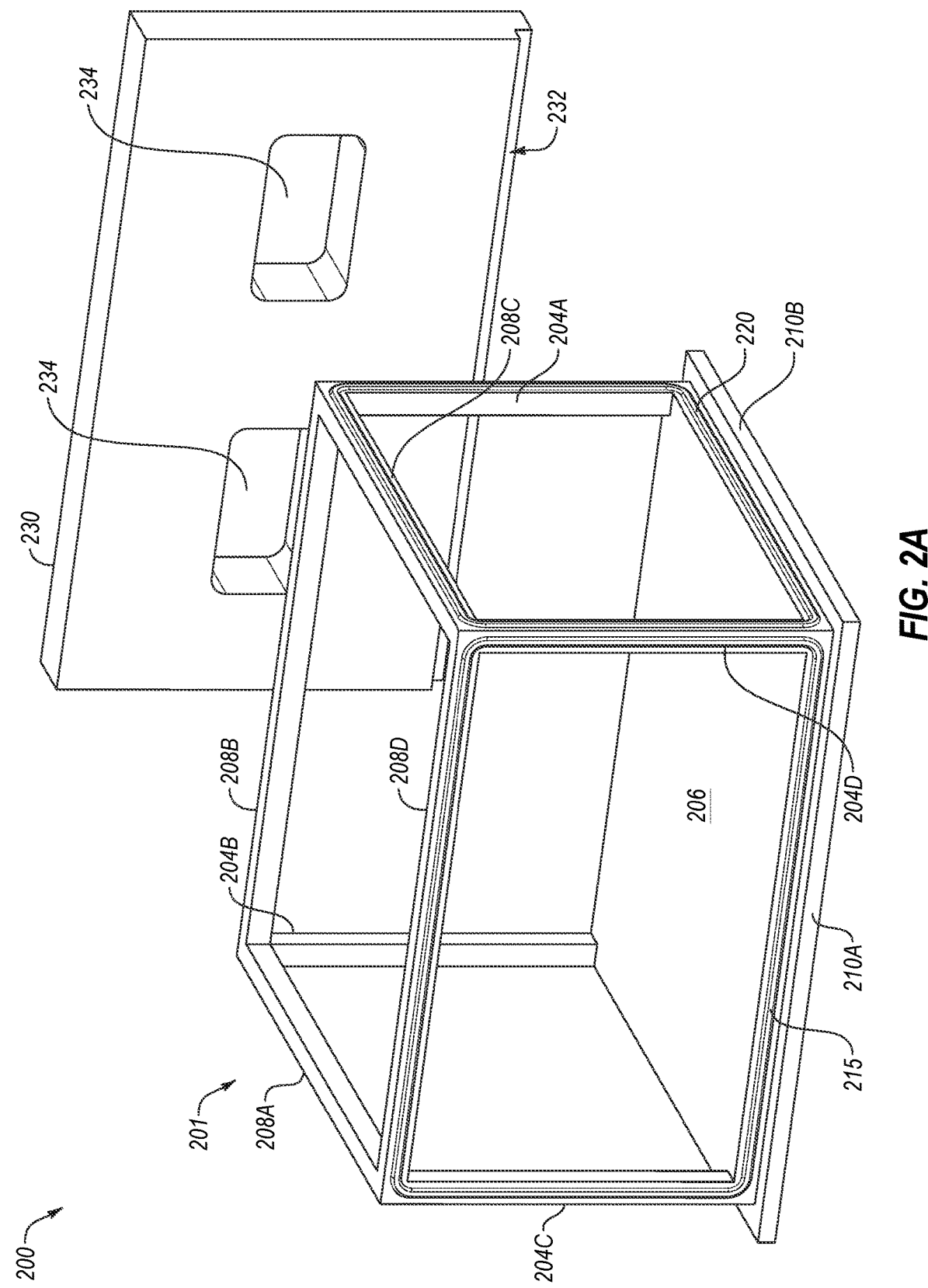
FIG. 2A illustrates a perspective view of a reconfigurable mainframe, in accordance with an embodiment of the present disclosure.

FIG. 2A illustrates a perspective view of a reconfigurable mainframe 200, in accordance with an embodiment of the present disclosure. The reconfigurable mainframe 200 may correspond to mainframe 104 of FIGS. 1A-C in an embodiment.

Reconfigurable mainframe 200 includes a base 206 on which a set of frames are mounted. Each frame may correspond to and frame a side or facet of the mainframe 200. The set of frames may conceptually be a single three dimensional frame 201 having multiple frame faces, where each of the frame faces frames a facet of the mainframe 200. The frame 201 may include columns 204A-D, and may further include beams 208A-D connecting the columns 204A-D. Each of the frames (or frame faces) may comprise a portion of the base, a pair of columns and a corresponding beam that connects the pair of columns. For example, base 206, columns 204B-C and beam 208A may make up a first frame (or frame face) for a first facet, base 206, columns 204A-B and beam 208B may make up a second frame (or frame face) for a second facet, base 206, columns 204A and 204D and beam 208C may make up a third frame (or frame face) for a third facet, and base 206, columns 204C-D and beam 208D may make up a fourth frame (or frame face) for a fourth facet.

Each of the frames (or frame faces) may include a lip 210A, 210B in the base 206. The lip 210A-B may be configured to support forces transferred to the lip 210A-B by a replaceable interface plate attached to a facet. Additionally, each of the frames (or frame faces) may include a groove or other feature that accepts an o-ring 215, 220. The o-ring may seal a replaceable interface plate to the frame (or frame face).

As illustrated, a replaceable interface plate 230 attaches to a frame (or frame face) of a facet of the mainframe 200. The replaceable interface plate 230 may be attached to the frame via bolts, screws, and/or other attachment mechanisms. The replaceable interface plate 230 may include a configured number, size and location of substrate access ports 234, 236, each of which may be configured to provide access for a robot arm to a process chamber. The replaceable interface plate 230 may also have slit valves (not shown), LCFs (not shown) and/or other components attached thereto or integrated therein.

The replaceable interface plate 230 may be a metal plate. For example, the replaceable interface plate may be formed from aluminum, an aluminum alloy, steel, or another metal. In some embodiments, the replaceable interface plate includes a surface treatment, such as a coating or anodization layer (e.g., an $Al_2O_3$ anodization layer). Examples of coatings include coatings deposited by chemical vapor deposition (CVD), atomic layer deposition (ALD), electroplating, and so on. Some example coatings include dielectric coatings, $Al_2O_3$ coatings, nickel plating, $Y_2O_3$ coatings, and so on. The replaceable interface plate 230 may be coated prior to attachment to the mainframe 200. Alternatively, the mainframe 200 may be coated after replaceable interface plates have been attached. Accordingly, in some embodiments portions of the replaceable interface plate 230 have the surface treatment.

The replaceable interface plate 230 additionally includes a step 232 on an interior bottom surface of the replaceable interface plate 230. The step may mate with a lip on a sidewall of the base 206 that forms a frame (or frame face) to which the replaceable interface plate 230 is mounted.

The mainframe is configured to operate under vacuum, which can cause large vertical and horizontal forces to be applied to the mainframe 200 based on a pressure difference between the interior volume of the mainframe and an exterior of the mainframe (e.g., which may be at atmospheric pressure). The frame 201, if exposed to the forces, may bend and/or buckle. Accordingly, in embodiments the replaceable interface plates (e.g., replaceable interface plate 230) are designed to be load bearing for the mainframe 200, and the frame of the first facet is not load bearing. Thus, the replaceable interface plate 230 bears vertical forces on the mainframe 200 caused by differences in pressure between the interior volume of the mainframe and an exterior of the mainframe. These vertical forces may be transferred from the replaceable interface plate 230 to the base at an interface of the step 232 and the lip of the base that is mated with the step 232.

In one embodiment, a vertical force of approximately 95,000 pounds of pressure is applied to the mainframe 200 when it is under vacuum. In an embodiment in which two facets have lengths of about 100-150 inches, and two facets have lengths of about 40-60 inches, about 30-40% of the vertical force is supported by each of the replaceable interface plates attached to long facets, and about 10-15% of the force is supported by each of the replaceable interface plates attached to short facets. Accordingly, a single replaceable interface plate may be configured to bear a force of about 28,500 to 38,000 pounds of force without flexing.

In an alternative embodiment, a step and lip are not used to transfer vertical forces from one or more of the replaceable interface plates to the base 206. Rather than a mated step and lip, the replaceable interface plate 230 may include pins on an interior bottom surface of the replaceable interface plate. The pins may be, for example, square or round pins, and may be periodically spaced. The plurality of pins may mate with one or more features in a sidewall of the base, and the vertical forces may be transferred from the replaceable interface plate to the base at an interface of the plurality of pins and the one or more features. The features may be, for example, holes, a lip, or other features that mate with the pins.

In an alternative embodiment, the base extends out beneath the replaceable interface plates, and vertical forces may be transferred from the replaceable interface plates to the base without the use of any steps, lips, pins or other features in the base or replaceable interface plates.

Though not shown, additional replaceable interface plates may be attached to the remaining facets of the mainframe 200. Additionally, a lid may be secured to a top of the mainframe over the frame 201 and over the replaceable interface plates. In embodiments, the lid contacts the replaceable interface plates but does not contact the frame 201. This ensures that even if there is a slight misalignment in the vertical spacing of the lip, step, top of a replaceable interface plate and/or top of the frame 201, the frame will not bear any load.

Figure 2B:
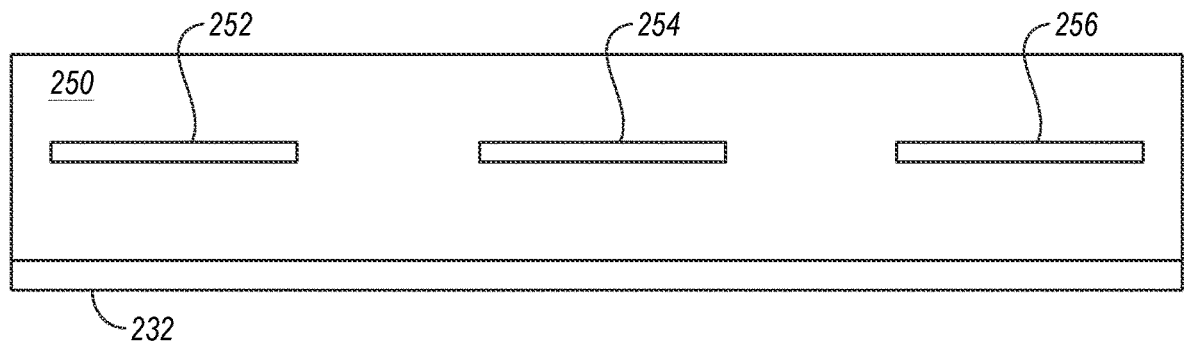
FIG. 2B illustrates a side view of a first example replaceable interface plate, in accordance with an embodiment of the present disclosure.

FIG. 2B illustrates a side view of a first example replaceable interface plate 250, in accordance with an embodiment of the present disclosure. The first replaceable interface plate 250 includes a step 232 and three substrate access ports 252, 254, 256 that all have the same width, height and vertical position.

Figure 2C:
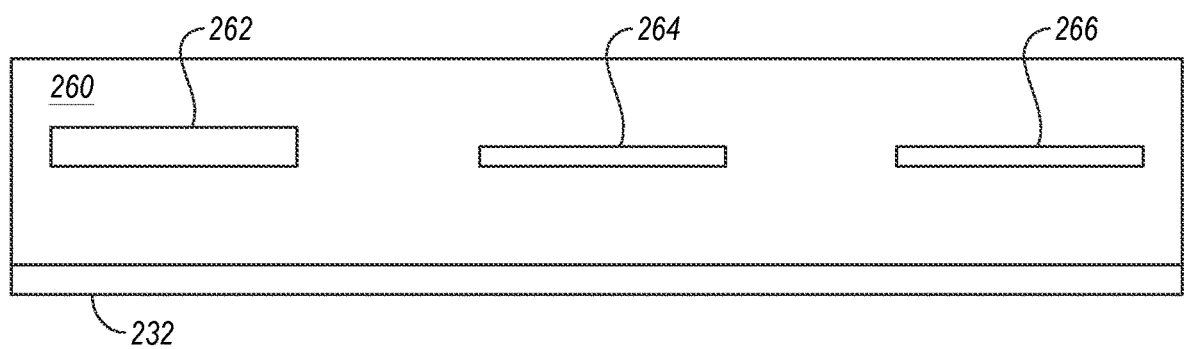
FIG. 2C illustrates a side view of a second example replaceable interface plate, in accordance with an embodiment of the present disclosure.

FIG. 2C illustrates a side view of a second example replaceable interface plate 260, in accordance with an embodiment of the present disclosure. The second replaceable interface plate 260 includes a step 232 and three substrate access ports 262, 264, 266 that have varying widths and heights.

Figure 2D:
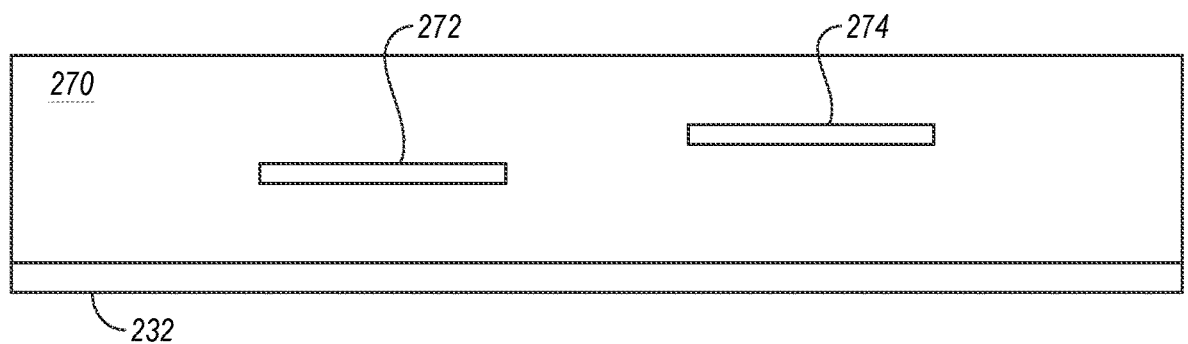
FIG. 2D illustrates a side view of a third example replaceable interface plate, in accordance with an embodiment of the present disclosure.

FIG. 2D illustrates a side view of a third example replaceable interface plate 270, in accordance with an embodiment of the present disclosure. The third replaceable interface plate 270 includes a step 232 and two substrate access ports 272, 274 that have equal widths and heights, but different vertical position.

Any of the first example replaceable interface plate 250, second example replaceable interface plate 260 or third example replaceable interface plate 270 may be attached to the mainframe 200 in embodiments.

Figure 3:
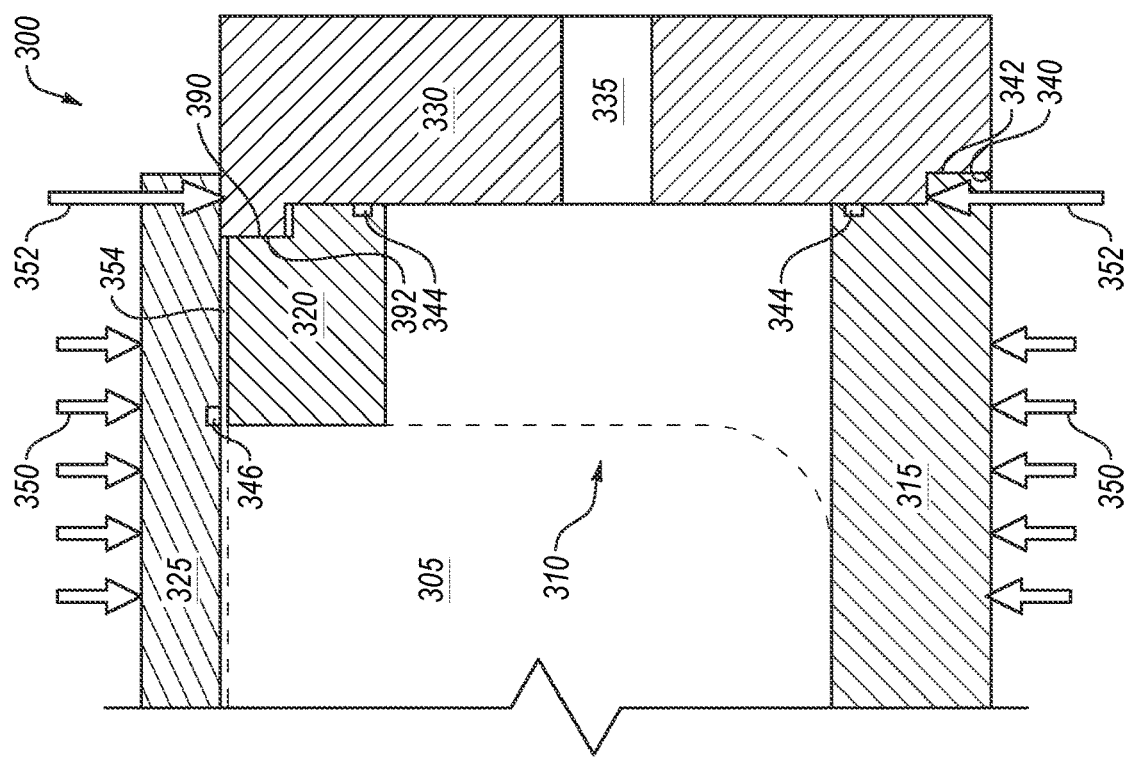
FIG. 3 depicts a cross sectional side view of a mainframe and an attached replaceable interface plate, taken at a location of a substrate access port, in accordance with an embodiment of the present disclosure.

FIG. 3 depicts a cross sectional side view of a mainframe 300 and an attached replaceable interface plate 330, taken at a location of a substrate access port 335 machined into the replaceable interface plate 330, in accordance with an embodiment of the present disclosure. The mainframe 300 includes a base 315, a frame face (comprising a beam 320, multiple columns (not shown) and a portion of the base), and a lid 325. The beam 320, base 315 and columns (not shown) define a frame (or frame face) for a facet 310 of the mainframe 300. The replaceable interface plate 330 is attached to the frame that frames the facet 310 of the mainframe 300.

The base 315 includes a lip 340 on a sidewall of the base 315. The replaceable interface plate 330 includes a step 342 on an interior bottom surface of the replaceable interface plate 330, wherein the step 342 mates with the lip 340 on the sidewall of the base 315. As previously described, forces 350 may be applied to the mainframe 300 when an interior volume 305 of the mainframe 300 is pumped down to vacuum. These forces may be a concentrated force 352 that the replaceable interface plate 330 bears. As shown, the lid 325 may contact the replaceable interface plate 330, but may not contact the beam 320. For example, there may be a small gap 354 between a bottom of the lid 325 and a top of the beam 320. Accordingly, the force is transferred from the lid 325, through the replaceable interface plate 330, and to the lip 352 of the base 315.

The lid 325 may include a notch or groove 346 into which an o-ring may be inserted to ensure a seal between the lid 325 and the beam 320 (e.g., between the lid and a top of a frame that includes the beam 320). Additionally, the frame for the facet to which the replaceable interface plate 330 attaches (e.g., including beam 320, columns (not shown) and sidewall of the base) may each include a notch or groove 344 into which an o-ring may be inserted to ensure a seal between the replaceable interface plate 330 and the frame.

In one embodiment, the replaceable interface plate 330 includes a lip 390 at a top of an interior surface of the replaceable interface plate 330. The beam 320 may include a corresponding step 392 that may mate with the lip 390. Notably, a top of the step 392 does not contact a bottom of the lip 390. In other embodiments, the replaceable interface plate 330 does not include a lip, and the beam 320 does not include a step.

Figure 4:
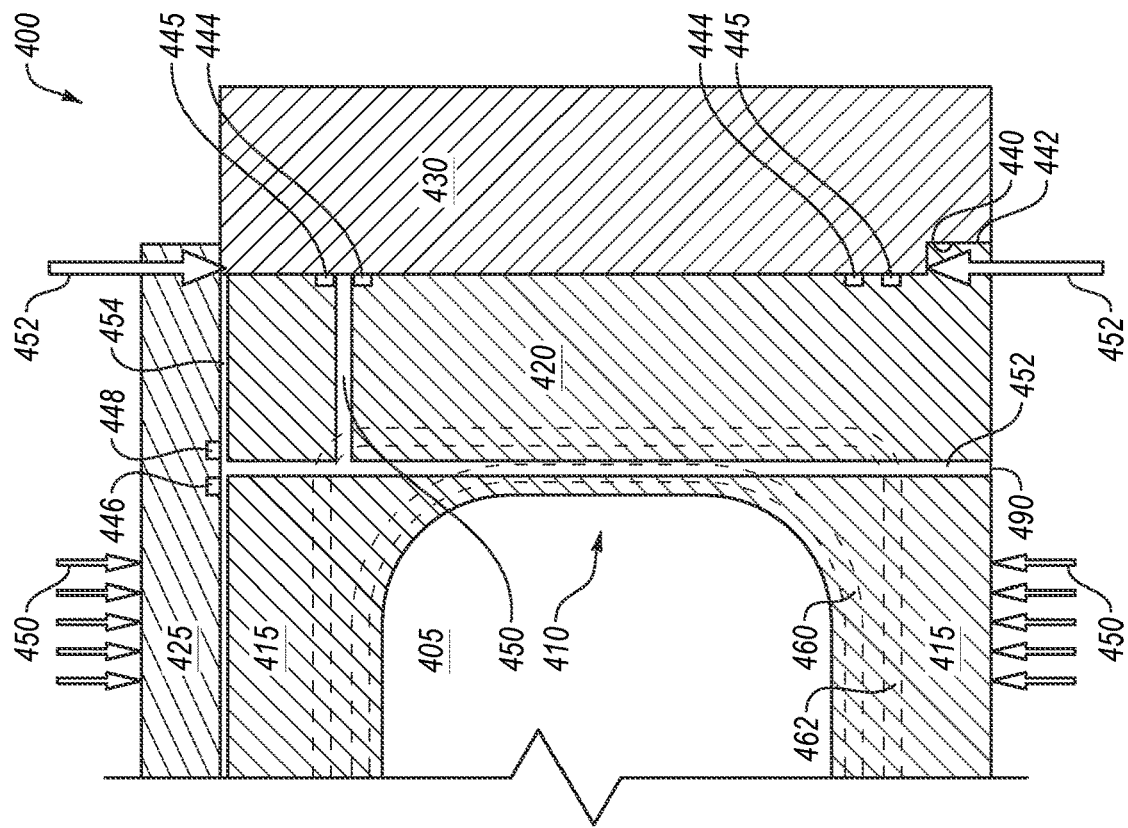
FIG. 4 depicts a cross sectional side view of a mainframe and an attached replaceable interface plate, taken at a location of a column of a frame of the mainframe, in accordance with an embodiment of the present disclosure.

FIG. 4 depicts a cross sectional side view of a mainframe 400 and an attached replaceable interface plate 430, taken at a location of a column 420 of a frame of the mainframe, in accordance with an embodiment of the present disclosure. The mainframe 400 includes a base 415, a frame (comprising multiple beams 421, multiple columns 420 and portions of the base) and a lid 325. A first beam (not shown), column 420, and first portion of the base 415 define a first frame face for a facet 410 of the mainframe 400. A second beam 421, column 420, a second column (not shown), and a second portion of the base 415 define a second face frame for a second facet. The replaceable interface plate 430 is attached to the frame that frames the facet 410 of the mainframe 400.

The base 415 includes a lip 440 on a sidewall of the base 415. The replaceable interface plate 430 includes a step 442 on an interior bottom surface of the replaceable interface plate 430, wherein the step 442 mates with the lip 440 on the sidewall of the base 415. As previously described, forces 450 may be applied to the mainframe 400 when an interior volume of the mainframe 400 is pumped down to vacuum. These forces may be a concentrated force 452 that the replaceable interface plate 430 bears. As shown, the lid 425 may contact the replaceable interface plate 430, but may not contact the frame. For example, there may be a small gap 454 between a bottom of the lid 425 and a top of the frame. Accordingly, the force is transferred from the lid 425, through the replaceable interface plate 440, and to the lip 442 of the base 415.

The lid 425 may include a pair of notches or grooves 446, 448 into which o-rings may be inserted to ensure a seal between the lid 425 and the frame. In one embodiment, notch 446 is approximately concentric with notch 448. Additionally, the frame for the facet to which the replaceable interface plate 430 attaches (e.g., including the beam (not shown), column 420, additional column (not shown) and sidewall of the base) may each include a pair of notches or grooves 444, 445 into which o-rings may be inserted to ensure a seal between the replaceable interface plate 430 and the frame. The notch 444 and the notch 445 may be approximately concentric in some embodiments.

A region between the notches 446 and 448 may be an intermediate vacuum region. Similarly, a region between the notches 444 and 445 may be another intermediate vacuum region. The column 420 may include one or more channels (i.e. holes) that fluidly couple the intermediate vacuum regions to a vacuum port 490. For example, the column 420 may include a vertical channel 452 that fluidly couples the intermediate vacuum region between notches 446, 448 to vacuum port 490, and may further include a horizontal channel 450 that fluidly couples the intermediate vacuum region between notches 444, 445 to the vertical channel 452.

Differential pumping may be performed to pump the intermediate vacuum regions to a pressure that is between a pressure of the interior volume of the mainframe 400 and atmospheric pressure. A first o-ring may be disposed in notch 445 of the frame, wherein an exterior surface of the first o-ring is exposed to an external environment, and wherein an interior surface of the first o-ring is exposed to the intermediate vacuum region. A second o-ring may be disposed in notch 444 of the frame, wherein an exterior surface of the second o-ring is exposed to the intermediate vacuum region, and wherein an interior surface of the second o-ring is exposed to the interior volume of the mainframe 400. The external environment has a first pressure, the intermediate vacuum region is to maintain a second pressure that is lower than the first pressure, and the interior volume is to maintain a third pressure that is lower than the second pressure.

A second frame face for a second facet that is perpendicular to the facet 410 is also shown. The second frame face includes beam 421, column 420 and base 415. A large opening 405 is framed by the second frame face. As shown, notches or grooves 460, 462 are machined into the beam 421, base 415 and column 420, where the notches 460, 462 are each to receive an o-ring to seal an additional replaceable interface plate (not shown) to the second facet of the mainframe 400. The frame (or frame face) of the facet 410 may further comprise one or more additional channels in the column 420 that fluidly couple to channel 452. These additional one or more channels may fluidly couple an intermediate vacuum region between notches 460, 462 to vacuum port 490.

Additional frames (or frame faces) of the mainframe may also include channels drilled or otherwise formed therein. These channels may connect to additional intermediate vacuum regions between other pairs of notches/o-rings. These channels may fluidly couple to the channel 452 in column 420, and therefore to the vacuum port 490. The frame (or frame face) of the facet 410 may further comprise one or more additional channels in the beam 421, and/or additional beam (not shown), and/or base 415 that fluidly couple to the one or more channels in the column 420. These channels may further be fluidly coupled to one or more additional channels in additional columns that fluidly connect still further intermediate vacuum regions to the vacuum port 490.

In an example, a first frame (or first frame face) includes a first column on a first side of a first facet, a second column on a second side of the first facet, and a first beam that connects the first column to the second column. A second frame (or second frame face) includes the first column on a first side of a second facet, a third column on a second side of the second facet, and a second beam that connects the first column to the third column. A third frame (or third frame face) includes the second column on a first side of a third facet, a fourth column on a second side of the third facet, and a third beam that connects the second column to the fourth column. A fourth frame (or fourth frame face) includes the third column on a first side of a fourth facet, the fourth column on a second side of the fourth facet, and a fourth beam that connects the third column to the fourth column.

The first frame may include one or more first channels in the first column, wherein the one or more first channels fluidly couple a first intermediate vacuum region to a vacuum port. The first frame may further include one or more second channels in the first beam that fluidly couple to the one or more channels in the first column.

The first frame may further comprise one or more third channels in the second column that fluidly couple to the one or more second channels in the beam. The one or more third channels may fluidly couple the vacuum port to an additional intermediate vacuum region between a pair of o-rings disposed on an exterior surface of the second frame.

Alternatively, or additionally, the third frame may include one or more additional channels in the third beam of the third frame. Additionally, the third frame may include one or more additional channels in the fourth column that fluidly couple one or more intermediate vacuum regions between additional pairs of o-rings to the vacuum port.

The vacuum port 490 may be coupled to a vacuum pump (not shown). Differential pumping may be performed to reduce the pressure difference across o-rings. The o-rings may have a large linear surface (e.g., in embodiments in which a facet may have a length of up to about 130 or 150 inches and a height of about 20-50 inches). This can increase leakage across an o-ring, and reduce a sealing capability. By using differential pumping, the rate of leakage can be drastically reduced. A single vacuum port 490 may fluidly couple to intermediate vacuum regions between all pairs of o-rings between the mainframe and the lid and replaceable interface plates in embodiments. These connections may be made by drilling channels (i.e., holes) in one or more of the beams and/or columns of the frame or frames of the mainframe 400, and may provide connections to the vacuum port 490 without the use of plugging, cross drilling, or welding (e.g., plug welds). This can improve an operation of the differential pumping by minimizing additional possible leakage points.

In further embodiments, multiple stages of differential pumping are used, which may include sets of three concentric notches or grooves, each with its own o-ring, and two adjacent intermediate vacuum regions.

Figure 5:
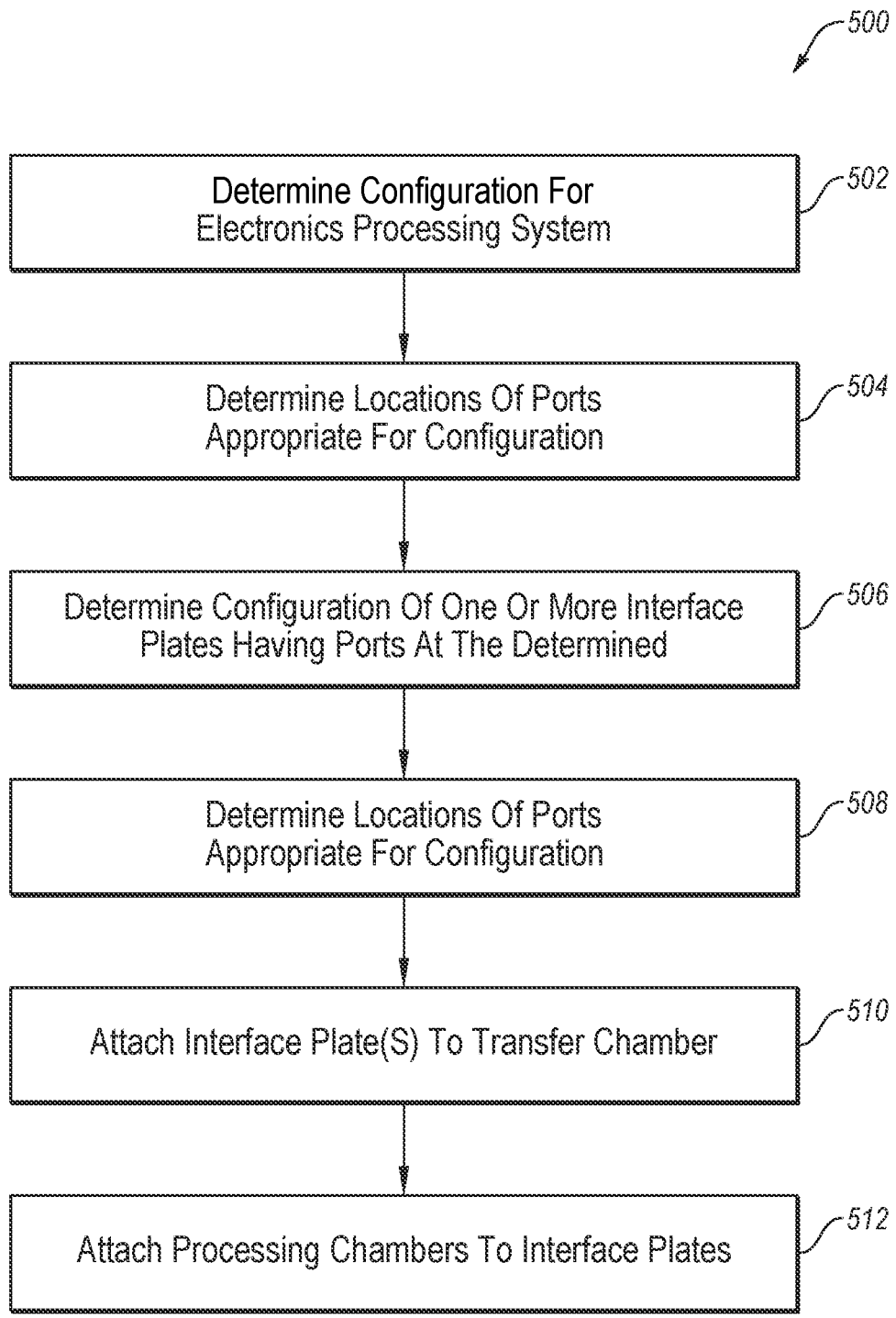
FIG. 5 illustrate a process for assembling a reconfigurable mainframe of an electronic device manufacturing system, in accordance with an embodiment of the present disclosure.

FIG. 5 illustrates a method 500 for assembling a reconfigurable mainframe of an electronic device manufacturing system, in accordance with an embodiment of the present disclosure. Some operations of method 500 may be performed by processing logic, which may execute on a computing device such as a general purpose computer. For example, some operations may be performed using computer aided drafting and/or computer aided manufacturing (CAM) software installed on a computer.

At block 502 of method 500, a mainframe configuration is determined, including making a determination of a first plurality of process chambers to be coupled to a first facet of a mainframe. Additionally, determinations may be made of load locks and/or process chambers to be connected to one or more other facets of the mainframe.

At block 504, a determination may be made of locations of substrate access ports appropriate for the determined mainframe configuration (e.g., that will accommodate access to each of the process chambers and/or load locks). At block 506, configurations of one or more replaceable interface plates are determined. The replaceable interface plates may be configured to have substrate access ports at each of the determined locations. At block 508, the replaceable interface plates may be manufactured. This may include machining a metal (e.g., aluminum) and/or applying a surface treatment to at least a portion of the replaceable interface plates.

At block 510, the replaceable interface plates are attached to the mainframe (transfer chamber). This may include bolting or screwing the replaceable interface plates to the frames of the appropriate facets of the mainframe. At block 512, the determined process chambers and/or load locks may then be attached to the appropriate interface plates as per the determined configuration.

At any time an engineer may determine a new configuration for the mainframe. At such a time, the method 500 may be repeated. For example, a determination of a second plurality of process chambers to be coupled to the first facet of the mainframe may be made, new locations of a second plurality of substrate access ports on the facet that will accommodate the second plurality of process chambers may be determined, a configuration of a second replaceable interface plate having one of the second plurality of substrate access ports at each of the new locations may be determined, and the second replaceable interface plate may be manufactured. The second replaceable interface plate may have at least one of a) a different number of substrate access ports than the first replaceable interface plate, b) different locations of one or more substrate access ports as compared to the plurality of substrate access ports in the first replaceable interface plate, c) different sizes of one or more substrate access ports as compared to the plurality of substrate access ports in the first replaceable interface plate, d) a different type of slit valves than the first replaceable interface plate, or e) a different type of local center finder than the first replaceable interface plate.

Prior to block 510, the existing process chambers may be removed from the first replaceable interface plate, followed by removal of the first replaceable interface plate from the mainframe. Subsequently, the operations of blocks 510 and 512 may be performed, causing the mainframe to have an entirely new configuration (e.g., with different numbers of substrate access ports, different positions of substrate access ports, different numbers and/or types of process chambers, and so on).

In the foregoing description, numerous specific details are set forth, such as specific materials, dimensions, processes parameters, etc., to provide a thorough understanding of the present disclosure. The particular features, structures, materials, or characteristics may be combined in any suitable manner in one or more embodiments. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is simply intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. Reference throughout this specification to "an embodiment", "certain embodiments", or "one embodiment" means that a particular feature, structure, or characteristic described in connection with the embodiment is included in at least one embodiment. Thus, the appearances of the phrase "an embodiment", "certain embodiments", or "one embodiment" in various places throughout this specification are not necessarily all referring to the same embodiment.

The present disclosure has been described with reference to specific exemplary embodiments thereof. The specification and drawings are, accordingly, to be regarded in an illustrative rather than a restrictive sense. Various modifications of the disclosure in addition to those shown and described herein will become apparent to those skilled in the art and are intended to fall within the scope of the appended claims.

I claim:

1. A mainframe of a device fabrication system, comprising: a base;
a plurality of facets on the base, wherein each facet of the plurality of facets comprises a frame;
a plurality of replaceable interface plates, each replaceable interface plate of the plurality of replaceable interface plates attached to a respective facet of the plurality of facets such that at most one replaceable interface plate is attached to each facet, wherein at least one replaceable interface plate of the plurality of replaceable interface plates comprises one or more substrate access ports, and wherein one or more replaceable interface plates of the plurality of replaceable interface plates are load bearing;
a lid over the plurality of facets, wherein the base, the lid and the plurality of facets with the attached plurality of replaceable interface plates together define an interior volume; and
a robot arm in the interior volume.

2. The mainframe of claim 1, wherein a first facet of the plurality of facets has a first length that is at least two times a second length of a second facet of the plurality of facets.

3. The mainframe of claim 2, wherein the mainframe has a rectangular shape, wherein the plurality of facets comprises four facets, wherein the second facet is perpendicular to the first facet, and wherein the robot arm is an off-axis robot arm.

4. The mainframe of claim 1, wherein the mainframe is configured to operate under vacuum, and wherein the frame of one or more of the plurality of facets is not load bearing with respect to a load caused by the vacuum.

5. The mainframe of claim 1, wherein the one or more replaceable interface plates bear vertical forces on the mainframe caused by differences in pressure between the interior volume of the mainframe and an exterior of the mainframe.

6. The mainframe of claim 5, wherein the one or more the replaceable interface plates comprise a step on an interior bottom surface of the one or more replaceable interface plates, wherein the step mates with a lip on a sidewall of the base, and wherein the vertical forces are transferred from the one or more replaceable interface plates to the base at an interface of the step and the lip.

7. The mainframe of claim 1, wherein the lid is engaged with a top surface of the one or more replaceable interface plates with a gap between the lid and the top surface of the frame of one or more of the plurality of facets such that the lid does not contact the frame of the one or more of the plurality of facets.

8. The mainframe of claim 5, wherein the one or more replaceable interface plates comprise a plurality of pins on an interior bottom surface of the one or more replaceable interface plates, wherein the plurality of pins mate with one or more features in one or more sidewall of the base, and wherein the vertical forces are transferred from the one or more replaceable interface plates to the base at an interface of the plurality of pins and the one or more features.

9. The mainframe of claim 1, further comprising:
a first o-ring disposed on an exterior surface of a first frame of a first facet of the plurality of facets, wherein an exterior surface of the first o-ring is exposed to an external environment, and wherein an interior surface of the first o-ring is exposed to an intermediate vacuum region; and
a second o-ring disposed on the exterior surface of the first frame, wherein the second o-ring is approximately concentric with the first o-ring, wherein an exterior surface of the second o-ring is exposed to the intermediate vacuum region, and wherein an interior surface of the second o-ring is exposed to the interior volume;
wherein the external environment has a first pressure, wherein the intermediate vacuum region is to maintain a second pressure that is lower than the first pressure, and
wherein the interior volume is to maintain a third pressure that is lower than the second pressure.

10. The mainframe of claim 9, wherein the first frame comprises: a first column on a first side of the first facet;
a second column on a second side of the first facet;
a beam that connects the first column the second column; and
one or more channels in the first column, wherein the one or more channels fluidly couple the intermediate vacuum region to a vacuum port.

11. The mainframe of claim 1, wherein the plurality of replaceable interface plates are disposed on the base.

12. The mainframe of claim 1, wherein:
a first replaceable interface plate of the plurality of replaceable interface plates has at least one of a first number of first substrate access ports, first locations for each of the first number of the first substrate access ports, first sizes of the first number of the first substrate access ports, a first type of slit valve, or a first type of local center finder; and
a second replaceable interface plate of the plurality of replaceable interface plates has at least one of a second number of second substrate access ports, second locations for each of the second number of the second substrate access ports, second sizes of the second number of the second substrate access ports, a second type of slit valve, or a second type of local center finder.

13. The mainframe of claim 1, wherein a first replaceable interface plate of the plurality of replaceable interface plates has a first size, and wherein a second replaceable interface plate of the plurality of replaceable interface plates has a second size that is different from the first size.

14. A replaceable interface plate for attachment to a facet of a mainframe, the replaceable interface plate comprising:
one or more substrate access ports each configured to provide access from the mainframe to a chamber;
wherein the replaceable interface plate is load bearing for the mainframe.

15. The replaceable interface plate of claim 14, wherein the replaceable interface plate is configured to bear vertical forces on the mainframe caused by differences in pressure between an interior volume of the mainframe and an exterior of the mainframe.

16. The replaceable interface plate of claim 14, further comprising:
a step on an interior bottom surface of the replaceable interface plate, wherein the step is configured to mate with a lip on a sidewall of a base of the mainframe;
wherein the replaceable interface plate is configured to cause vertical forces to be transferred from the replaceable interface plate to the base at an interface of the step and the lip.

17. The replaceable interface plate of claim 14, further comprising:
one or more local center finders attached to the replaceable interface plate, wherein the one or more local center finders are configured to detect wafers transferred through the one or more substrate access ports.

18. The replaceable interface plate of claim 14, further comprising:
a plurality of pins on an interior bottom surface of the replaceable interface plate, wherein the plurality of pins mate with one or more features in a sidewall of a base of the mainframe, wherein the replaceable interface plate is configured to cause vertical forces to be transferred from the replaceable interface plate to the base at an interface of the plurality of pins and the one or more features.

19. The replaceable interface plate of claim 14, wherein the one or more substrate access ports are a plurality of substrate access ports each configured to provide access from the mainframe to a different chamber.

20. A mainframe of a device fabrication system, comprising:
a base;
a plurality of facets on the base, wherein each facet of the plurality of facets comprises a frame;
a first replaceable interface plate attached to a first facet of the plurality of facets, the first replaceable interface plate comprising one or more first substrate access ports and having a first size;
a second replaceable interface plate attached to a second facet of the plurality of facets, the second replaceable interface plate comprising one or more second substrate access ports and having a second size that is different from the first size;
a lid over the plurality of facets, wherein the base, the lid and the plurality of facets together define an interior volume; and
a robot arm in the interior volume;
wherein the mainframe is configured to operate under vacuum, and wherein the first replaceable interface plate and the second replaceable interface plate are load bearing with respect to a load caused by the vacuum.

* * * * *